(12) United States Patent
Nagaraja et al.

(10) Patent No.: US 10,892,295 B2
(45) Date of Patent: Jan. 12, 2021

(54) GERMANIUM-MODIFIED, BACK-SIDE ILLUMINATED OPTICAL SENSOR

(71) Applicant: Microsoft Technology Licensing, LLC, Redmond, WA (US)

(72) Inventors: Satyadev Hulikal Nagaraja, San Jose, CA (US); Onur Can Akkaya, Palo Alto, CA (US); Cyrus Soli Bamji, Fremont, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 102 days.

(21) Appl. No.: 15/968,657

(22) Filed: May 1, 2018

(65) Prior Publication Data

US 2019/0214428 A1    Jul. 11, 2019

Related U.S. Application Data

(60) Provisional application No. 62/615,892, filed on Jan. 10, 2018.

(51) Int. Cl.
| | | |
|---|---|---|
| *H01L 27/146* | (2006.01) | |
| *H01L 31/18* | (2006.01) | |
| *H01L 31/0352* | (2006.01) | |
| *H01L 31/103* | (2006.01) | |
| *H04N 9/04* | (2006.01) | |

(Continued)

(52) U.S. Cl.
CPC .... *H01L 27/14687* (2013.01); *H01L 27/1462* (2013.01); *H01L 27/1464* (2013.01); *H01L 27/1465* (2013.01); *H01L 27/14627* (2013.01); *H01L 27/14629* (2013.01); *H01L 27/14698* (2013.01); *H01L 31/028* (2013.01); *H01L 31/02327* (2013.01); *H01L 31/035272* (2013.01); *H01L 31/103* (2013.01); *H01L 31/1804* (2013.01); *H01L 31/1812* (2013.01); *H04N 5/33* (2013.01); *H04N 9/045* (2013.01)

(58) Field of Classification Search
CPC ........... H01L 27/14687; H01L 27/1464; H01L 27/14685; H04N 9/045
See application file for complete search history.

(56) References Cited

U.S. PATENT DOCUMENTS

| | | |
|---|---|---|
| 7,741,666 B2 | 6/2010 | Nozaki et al. |
| 8,241,942 B2 | 8/2012 | Bourdelle et al. |

(Continued)

FOREIGN PATENT DOCUMENTS

| | | |
|---|---|---|
| DE | 102012213280 A1 | 5/2013 |
| EP | 3141927 A1 | 3/2017 |

(Continued)

OTHER PUBLICATIONS

"International Search Report and Written Opinion Issued in PCT Patent Application No. PCT/US2018/066343", dated Jun. 5, 2019, 21 Pages.

(Continued)

*Primary Examiner* — Mainul Hasan
(74) *Attorney, Agent, or Firm* — Alleman Hall Creasman & Tuttle LLP

(57) ABSTRACT

An imaging sensor array comprises an epitaxial germanium layer disposed on a silicon layer, and an electrically biased photoelectron collector arranged on the silicon layer, on a side opposite the germanium layer.

17 Claims, 7 Drawing Sheets

(51) Int. Cl.
  *H04N 5/33* (2006.01)
  *H01L 31/028* (2006.01)
  *H01L 31/0232* (2014.01)

(56) References Cited

U.S. PATENT DOCUMENTS

| | | | |
|---|---|---|---|
| 9,041,133 B2 | 5/2015 | Oganesian et al. | |
| 9,142,709 B2 | 9/2015 | Lu et al. | |
| 9,263,613 B2 | 2/2016 | Yu et al. | |
| 9,461,079 B2 | 10/2016 | Mouli | |
| 9,666,636 B2 | 5/2017 | Haddad et al. | |
| 2003/0034501 A1* | 2/2003 | Higgins, Jr. | H01L 27/0605 257/140 |
| 2006/0232779 A1* | 10/2006 | Shaw | G01J 3/42 356/436 |
| 2007/0158770 A1* | 7/2007 | Kawahito | G01S 7/4863 257/431 |
| 2008/0023738 A1 | 1/2008 | Lenchenkov | |
| 2008/0079045 A1* | 4/2008 | Bahl | H01L 27/1463 257/292 |
| 2008/0121805 A1* | 5/2008 | Tweet | H01L 27/14649 250/332 |
| 2009/0173976 A1* | 7/2009 | Augusto | H01L 31/107 257/292 |
| 2009/0200478 A1* | 8/2009 | Bethke | G01T 1/247 250/370.09 |
| 2010/0026824 A1* | 2/2010 | Chen | H01L 27/14692 348/222.1 |
| 2010/0032733 A1* | 2/2010 | Itou | H01L 29/66628 257/288 |
| 2010/0220226 A1* | 9/2010 | Wang | H01L 27/1464 348/294 |
| 2011/0287571 A1* | 11/2011 | Bourdelle | H01L 27/1464 438/73 |
| 2012/0032293 A1* | 2/2012 | Chen | H01L 21/823481 257/499 |
| 2012/0043637 A1* | 2/2012 | King | H01L 31/028 257/461 |
| 2013/0134535 A1* | 5/2013 | Lenchenkov | H01L 27/1464 257/432 |
| 2013/0228886 A1* | 9/2013 | JangJian | H01L 27/1464 257/432 |
| 2014/0054661 A1* | 2/2014 | Yu | B82Y 20/00 257/290 |
| 2014/0357010 A1* | 12/2014 | Lu | H01L 27/14687 438/57 |
| 2017/0018114 A1* | 1/2017 | Stewart | G06T 7/40 |
| 2017/0025467 A1* | 1/2017 | Haddad | H01L 27/14692 |
| 2017/0040362 A1* | 2/2017 | Na | H01L 27/14649 |

FOREIGN PATENT DOCUMENTS

| | | |
|---|---|---|
| WO | 9639719 A1 | 12/1996 |
| WO | 2017024121 A1 | 2/2017 |

OTHER PUBLICATIONS

Tiwari, et al., "Effects of Trap-Assisted Tunneling on Gate-Induced Drain Leakage in Silicon-Germanium Channel p-type FET for Scaled Supply Voltages", In Japanese Journal of Applied Physics, Mar. 1, 2016, 8 Pages.

* cited by examiner

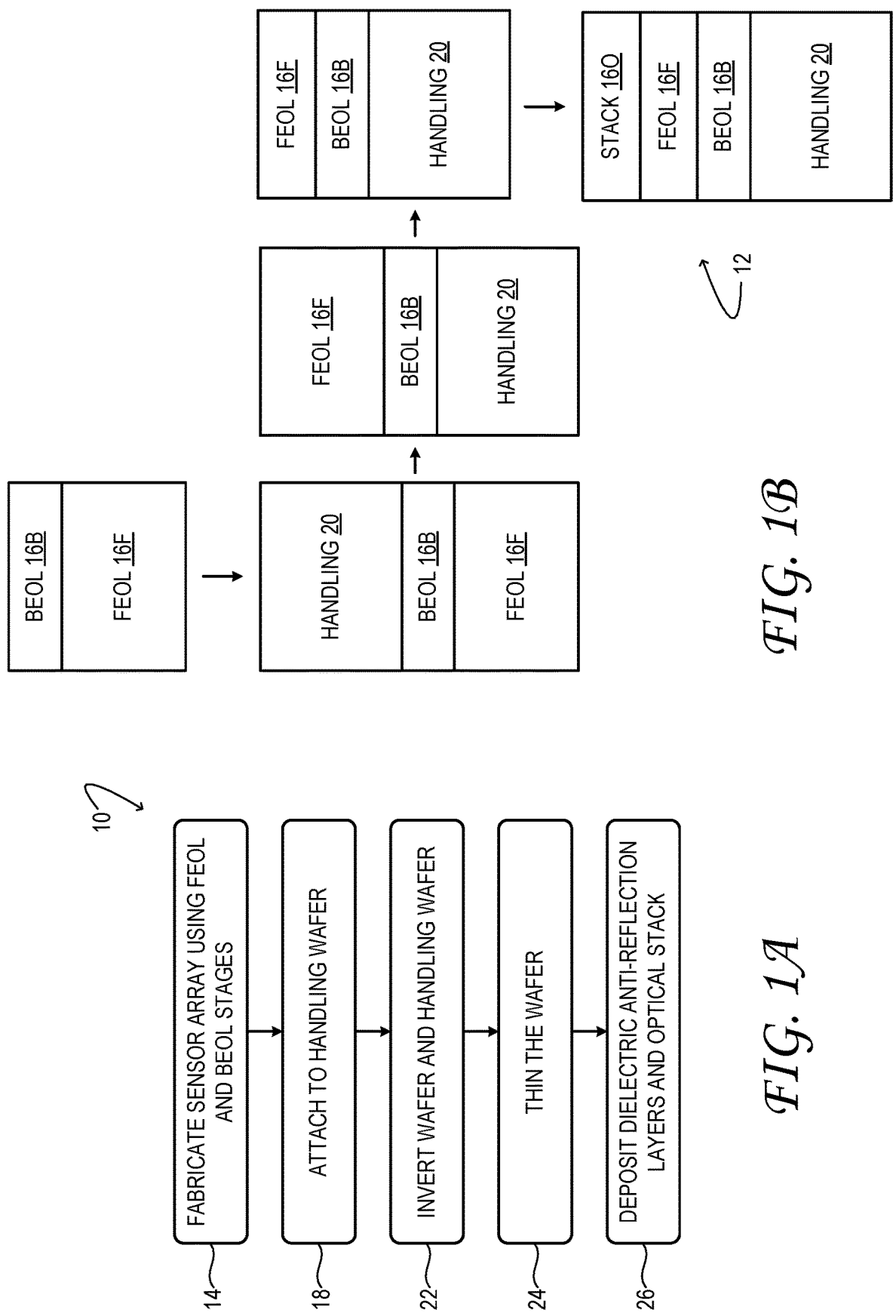

GERMANIUM-MODIFIED, BACK-SIDE ILLUMINATED OPTICAL SENSOR

CROSS REFERENCE TO RELATED APPLICATIONS

This application claims priority to U.S. Provisional Patent Application Ser. No. 62/615,892, filed Jan. 10, 2018, the entirety of which is hereby incorporated by reference herein for all purposes.

BACKGROUND

Terrestrial sunlight provides strong irradiance at and around 850 nanometers (nm), where state-of-the-art near-infrared (NIR) sensors typically operate. Some forms of artificial room lighting also provide significant irradiance in this range. Accordingly, ambient irradiance, especially from sunlight, may provide an undesirably large background for various NIR sensor applications.

SUMMARY

The disclosed examples relate to an imaging sensory array, such as a sensor array applicable to time-of-flight (TOF) depth imaging. The imaging sensor array comprises an epitaxial germanium layer disposed on a silicon layer, and an electrically biased photoelectron collector arranged on the silicon layer, on a side opposite the germanium layer. Additional disclosed examples relate to a method of fabrication of the imaging sensor array and to a TOF depth-imaging camera employing the imaging sensor array.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 1A illustrates an example method of fabricating an imaging sensor array.

FIG. 1B shows aspects of an example silicon-based, back-side illuminated time-of-flight sensor array through various stages of fabrication.

DETAILED DESCRIPTION

Figure 2B:
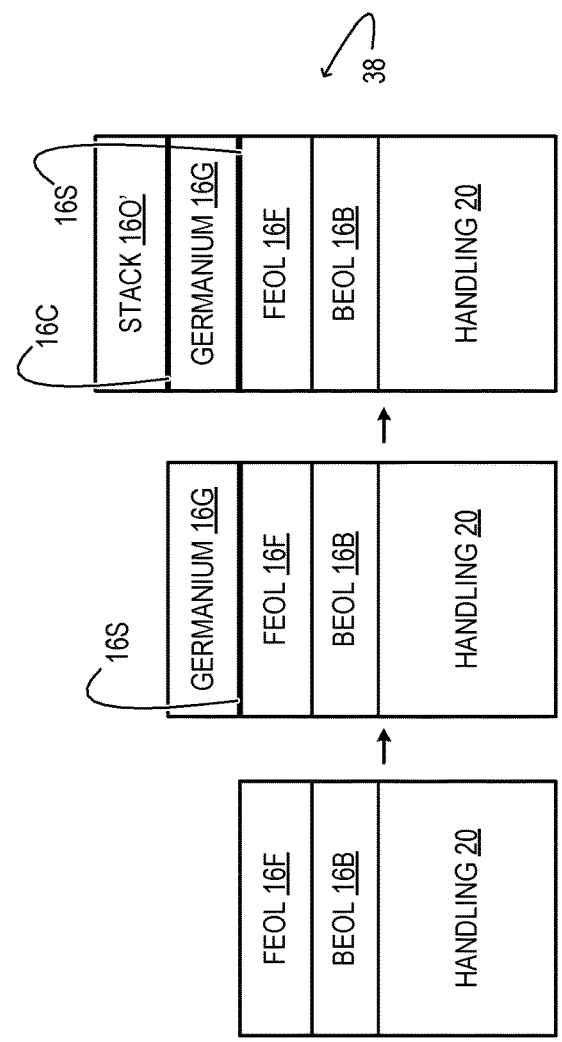
FIG. 2B shows aspects of an example germanium-modified, back-side illuminated time-of-flight sensor array through various stages of fabrication.

As noted above, terrestrial sunlight provides strong irradiance at and around 850 nm, where NIR optical sensors, including time-of-flight (TOF) sensors, often operate. The strong irradiance may correspond to a high background or noise level in the output from the optical sensor. One way to achieve an acceptable signal-to-noise (S/N) ratio, therefore, is to provide an emitter of relatively high power coupled operatively to the sensor. However, such an approach has various disadvantages, especially for optical systems that are battery-powered or intended to be used outdoors (where providing high enough emitter power may be impractical).

A different approach is to operate the optical-sensor somewhat deeper in the IR, where solar and other forms of ambient lighting contain less irradiance. Ideally, the operating point can be made to fall within one of the natural minima of the terrestrial insolation spectrum—e.g., in bands centered at 1130, 1380 or 1850 nm. Here the irradiance from sunlight is at least ten times less intense than at 850 nm. This approach, despite its advantages, also has disadvantages. In particular, the absorption coefficient of silicon (Si) falls sharply above 900 nm and is negligible at 1000 nm. Accordingly, the best-known semiconductor architecture of optical-sensor technology has poor response in the longer wavelength range.

In view of the foregoing issues, examples are disclosed that relate to an imaging sensor array having germanium (Ge) as the primary light absorbing element. The lower bandgap of germanium relative to silicon provides adequate absorptivity in the 1130 to 1600 nm range. The sensor is formed by growing an epitaxial (EPI) germanium layer on the back side of an Si-based TOF image-sensor wafer, which, after the completion of the BEOL process steps, has been bonded to a handling wafer, flipped, and thinned to a desired thickness. The germanium layer may be a planar layer of uniform thickness grown over the entire wafer, or it may be confined to just the pixel array or to an area within each pixel.

Additional aspects of this disclosure are now presented by way of example, and with reference to the drawing figures listed above. Components, process steps, and other elements that may be substantially the same in one or more of the figures are identified coordinately and are described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

FIG. 1A illustrates an example method 10 for fabricating an imaging sensor array, such as a TOF sensor array. FIG. 1B schematically shows the basic layer structure of the imaging sensor array in intermediate stages of the fabrication method. In one non-limiting example, method 10 may be used to form an Si-based, back side illuminated (BSI) TOF sensor array 12, starting with a conventionally prepared silicon wafer.

At 14 of method 10, a sensor array is fabricated on the wafer using a standard complementary metal-oxide-semiconductor (CMOS) process to pattern the wafer. The CMOS process comprises front-end-of-line (FEOL) and back-end-of-line (BEOL) stages, which form a structure having an FEOL (or silicon EPI) layer 16F and a BEOL layer 16B. In some examples, a photoelectron collector may be formed on the BEOL layer in the BEOL stage. In some examples, a metal contact may be arranged on the BEOL layer of the patterned wafer.

At 18, after completion of the BEOL stage, the patterned silicon wafer is attached to a handling wafer 20, to facilitate wafer transport and manipulation. The handling wafer 20 may also be a CMOS wafer containing circuitry that may be electrically coupled to the patterned wafer 16. At 22, the patterned silicon wafer and handling wafer are inverted for additional back-side processing. The additional back-side processing involves, at 24, thinning the patterned silicon wafer from the FEOL face, from about 800 μm down to <10 μm. A combination of chemical mechanical polishing (CMP) and wet etching, for example, may be used to enact the thinning. In examples where the desired product is an Si-based imaging sensor array 12, the final thickness of the silicon EPI layer of the wafer may fall between 6 and 10 μm. In other examples, to be described hereinafter, the final thickness of the silicon EPI layer may be less than 6 μm—e.g., 2 to 3 μm. In general, the desired final thickness of the silicon EPI layer may be determined as a trade-off between sensitivity and modulation contrast (vide infra). In the example shown in FIG. 1B, after thinning the wafer to its final thickness, an optical stack 160 comprising one or more dielectric anti-reflection layers, at 26, are deposited. Optionally, the dielectric anti-reflection layers may be followed by a micro-lens array to yield conventional Si-based TOF sensor array 12.

Figure 2A:
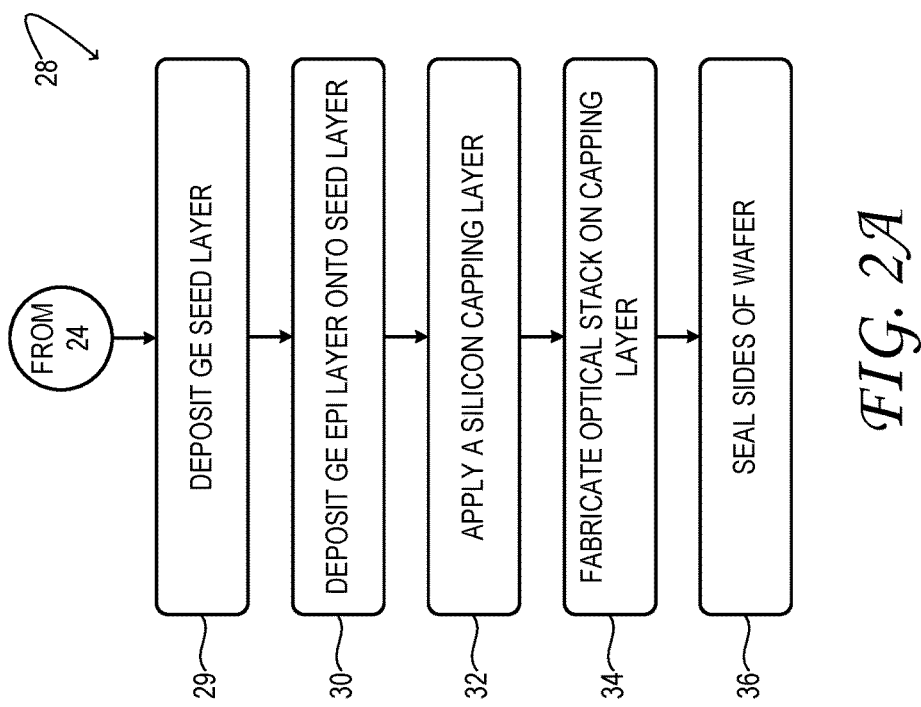
FIG. 2A illustrates modified and additional aspects of the method of FIG. 1A.

FIG. 2A illustrates various modified and additional steps 28 of example fabrication method 10. The modifications and additions presented in FIG. 2A result in an imaging sensor array having significantly extended wavelength response. FIG. 2B schematically shows the basic layer structure of the modified imaging sensor array at intermediate stages of the fabrication method. At 29 of method 10 (as an alternative to 26 of FIG. 1A) a thin epitaxial seed layer 16S of germanium is applied to exposed FEOL layer 16F. The seed layer may be about 20 angstrom units thick, in some examples. Chemical vapor deposition (CVD) or any other suitable method may be used to lay down the seed layer. In some examples, deposition of the seed layer may be plasma-enhanced. In some examples, deposition of the seed layer is conducted at a temperature not to exceed 410° C. More generally, the deposition temperature may be determined by the limit beyond which metal lines or other BEOL elements would be subjected to thermal-related stresses, which may result in sensor failure. Examples of relevant failure modes include electromigration and stress migration of copper, which may occur at temperatures greater than approximately 410° C.

Seed layer 16S may help to ensure that the crystal structure across the transition from silicon EPI layer 16F to a germanium adlayer (vide infra) has a suitably low defect density. At 30, accordingly, following application of the seed layer, a thicker germanium EPI layer 16G is deposited onto seed layer 16S. The germanium EPI layer may be applied using CVD or any other suitable method, to yield a silicon-germanium hybrid structure. The overall thickness of germanium EPI layer 16G is determined so as to provide the desired quantum efficiency for photoelectron collection and fast electron transport, as described further below.

At 32, after the desired thickness of germanium, ranging from 0.5 to 1.0 μm in some examples, is deposited, the germanium EPI layer 16G may be capped with a thin capping layer 16C of silicon. The capping layer may range from a few nanometers to tens of nanometers. The capping layer may serve to protect the germanium EPI layer and to form a base for subsequent deposition of silicon-based dielectric layers that form the optical stack. At 34, accordingly, an optical stack 160' is fabricated on top of the thin silicon capping layer 16C. These features are set down as part of a modified BSI process.

One concern regarding deposition of material on the back side of a thinned CMOS wafer is the possibility of contamination of the deposition chamber with ions from the metal lines applied to the BEOL layer, which lie exposed on the edge of the wafer. Accordingly, the sides of the wafer may be sealed, at 36, with an oxide or with any other suitable material that serves as a barrier against metal ion diffusion. The resulting Ge-modified hybrid imaging sensor array is shown at 38.

Figure 3:
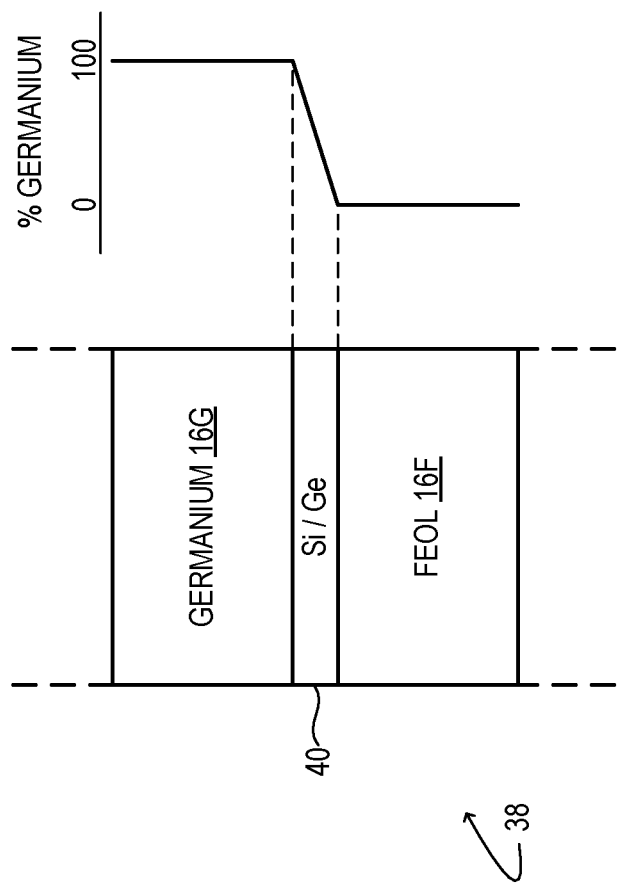
FIG. 3 shows aspects of an example graded silicon-germanium junction.

The fabrication described above in the context of FIG. 2A results in an abrupt Si—Ge junction between layers 16F and 16G. In other examples, the germanium composition may be varied gradually—e.g., from zero at the boundary of FEOL layer 16F to 100 percent at the boundary of germanium EPI layer 16G. The material gradation may be realized over a very short distance—e.g., 100 nanometers. This variant results in a graded transition layer 40, as shown in FIG. 3.

Figure 4:
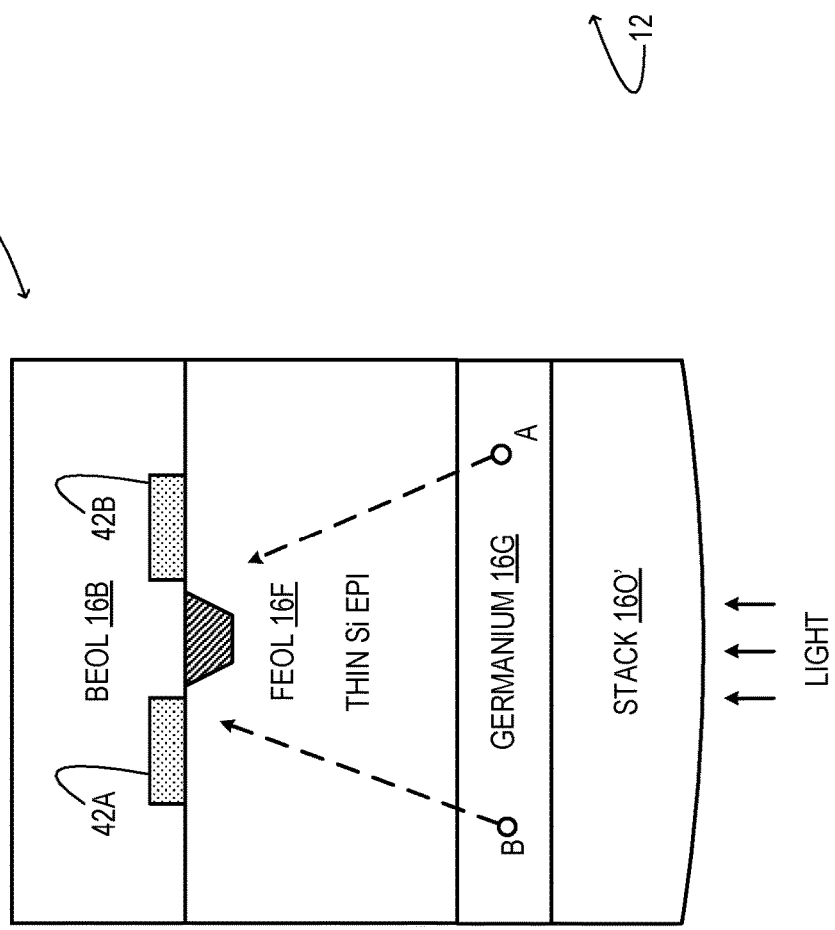
FIG. 4 shows aspects of photoelectron collection in an example germanium-modified, back-side illuminated time-of-flight sensor array.

FIG. 4 shows germanium EPI layer 16G of imaging sensor array 38, which is disposed on a silicon FEOL layer 16F. The germanium EPI layer may be configured to absorb the majority of the shorter-wavelength light—i.e., $\lambda$ 1000 nm, before such light interacts with Si—and a substantial portion of longer-wavelength light, $\lambda>1000$ nm, with silicon absorbing what remains for $\lambda \leq 1000$ nm. Silicon, by contrast, is very weakly absorbing beyond 1000 nm. Accordingly, whatever photoelectrons are generated in response to light of $\lambda>1000$ nm are generated in the germanium EPI layer.

FIG. 4 also shows an electrically biased photoelectron collector arranged in silicon BEOL layer 16B, on a side of FEOL layer 16F opposite germanium EPI layer 16G. In the illustrated example, imaging sensor array 38 is a time-of-flight sensor array, wherein the photoelectron collector includes first and second polyfinger electrodes 42A and 42B. The electrical bias applied to the first polyfinger electrode is shifted in phase with respect to the electrical bias applied to the second polyfinger electrode. The phase shift may be 180°, for example. In this configuration, photoelectrons generated by absorption of light are injected from germanium layer 16G into silicon layer 16F and move toward one or the other of the independently clocked polyfinger electrodes 42. The polyfinger electrodes serve as gates, driving the photoelectrons along an electrostatic potential gradient resulting from the electrical bias applied to the polyfingers. The distance that the injected electrons must travel to reach the polyfingers is nearly equal to the thickness of the silicon EPI; the time taken to do so is referred to as the transit time $t_e$. As described in further detail below, the $t_e$ value affects the modulation contrast (MC) of the TOF sensor array, especially at higher frequencies.

A suitably high modulation contrast (MC) improves the jitter and power performance of a TOF array by improving the signal-to-noise ratio, and an increase in frequency reduces the distance to modulation-phase ratio, which also reduces jitter and power dissipation. In sum, the shorter the $t_e$, the higher the MC, especially at high frequencies. In imaging sensor array 38, a suitably high MC is achieved at high frequencies by optimally positioning the germanium EPI layer with respect to the polyfingers—i.e., by optimally setting the silicon EPI thickness, and thereby reducing $t_e$.

Figure 5:
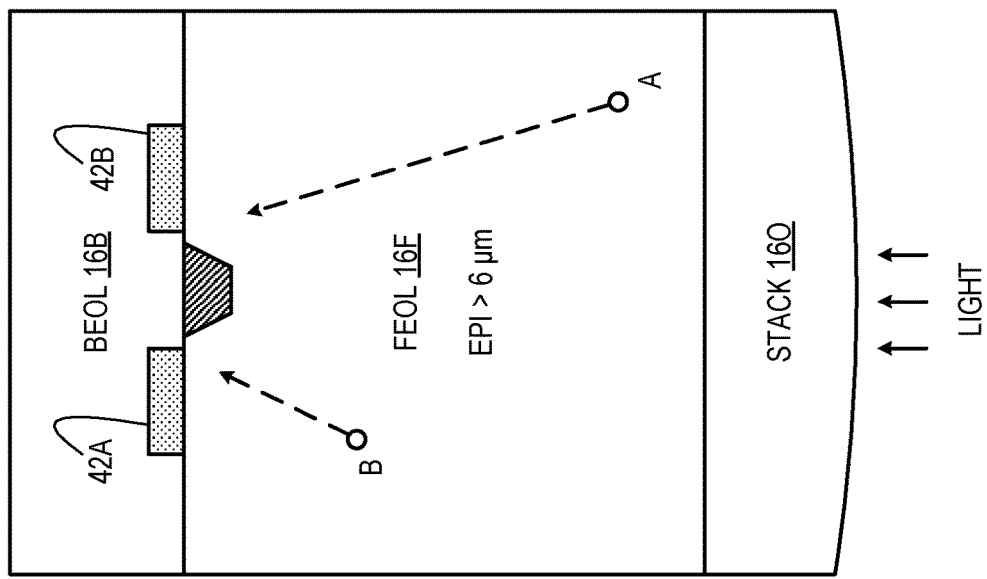
FIG. 5 shows aspects of photoelectron collection in an example silicon-based, back-side illuminated time-of-flight sensor array.

On the other hand, if the transit time $t_e$ is comparable to or longer than half the period T (½×frequency) of the clock signal on the polyfinger electrodes, then the MC may be severely degraded. Thus, a low $t_e$ facilitates high frequency operation. This can be achieved by (a) reducing the distance that the electrons must travel to the polyfinger electrodes, (b) increasing the mobility of the electrons within the semiconductor, and/or (c) increasing the vertical electric field strength. Of the three, the first may be achieved by reducing the thickness of the absorption layer. With silicon, however, this tactic may reduce the quantum efficiency in the IR region. In state-of-the-art TOF detectors, for instance, a relatively thick (>6 μm) layer of silicon is required for adequate absorbance, due to the low absorption coefficient of silicon in the infrared. However, this feature also increases $t_e$ for electrons generated deep in the EPI layer (farthest from the gate). This effect is illustrated in the conventional Si-based imaging sensor array of FIG. 5, where the photoelectron generated at A takes longer to reach polyfingers 42, as compared to the photoelectron generated at B. Consequently, MC degrades in the configuration of FIG. 5 as the operational frequency of the sensor increases, such that operation beyond 400 MHz is challenging.

By contrast, $t_e$ is relatively short for the sensors proposed according to method 2A, as the light absorption occurs substantially in the germanium layer. The photoelectrons diffuse through this layer and are injected across the Ge—Si interface and into the silicon EPI, as shown in FIG. 4. Moreover, the silicon EPI, being substantially thinner than that of a conventional TOF pixel, maintains a higher electric field for the same voltage applied to the polyfinger electrodes. This feature may result in a higher electron velocity. In sum, the short distance that the injected electrons must travel to the polyfingers combined with their higher velocity results in a short $t_e$. The MC may remain high, therefore, even at an operational frequency of 1 GHz.

The factors described above may be affected, to some degree, by doping. In some examples, the germanium EPI layer is p-doped at such concentration as to align the conduction bands of silicon and germanium to achieve substantially complete injection of electrons transported from within the germanium EPI layer to an interface between the silicon and germanium EPI layers. In these and other examples, the germanium EPI layer may be p-doped at such concentration as to prolong the lifetime of photoelectrons generated in the germanium EPI layer, to allow diffusion to an interface between the silicon and germanium EPI layers.

The desired thickness of germanium EPI layer 16G is determined by the opposing advantages of maximizing absorption (viz., the optical absorption path length) and enabling fast electron diffusion towards the Ge—Si interface, and further influenced by the desire to suppress dark current (vide infra). In the expected mode of operation, the germanium EPI layer supports little or no electric field. Therefore, electron transport across the germanium EPI layer is dominated by diffusion. Since diffusion is slow relative to drift, the use of a relatively thinner germanium layer may help to achieve a short $t_e$.

Dark current is larger for Ge-based photodetectors than for Si-based, owing to the much smaller band gap of germanium relative to Si. Moreover, state-of-the-art germanium-based photodetectors based on depleted p-n or p-i-n junctions exhibit much higher dark current for several additional reasons. First, these junctions have a more extensive depletion region, which maximizes the thermal generation volume and enhances leakage effects—e.g., trap assisted tunneling (TAT). Second, ohmic contacts are typically fabricated directly onto the p- and n-regions, which cause leakage due to contact-etch damage. Third, in lateral diodes, the p-n or p-i-n junctions are in contact with the gate dielectric or with a passivating oxide layer, which enhances the generation-recombination (G-R) rate at the interface.

However, the configuration of imaging sensor array 38 may avoid excessive dark current by averting the above contributory factors. In particular, both the electric field in the germanium EPI layer and the extent of the depletion region are reduced. First, the germanium EPI layer may be deposited as a planar layer with either uniform p-doping or a very small doping gradient. In the latter case, the gradient may be so small that the associated electric field is negligible, so effects associated with high electric fields, such as enhanced carrier generation due to TAT, may be absent. In other words, the germanium EPI layer may be p-doped with a gradient, so as to impart an electric field low enough to avoid trap-assisted tunneling (TAT) but adequate to provide driving force to photoelectrons generated within the germanium EPI layer to drift to an interface between the silicon and germanium EPI layers. Second, since there are no p-n junctions in or near the germanium EPI layer, there may be no large depletion regions within it, where thermal generation may contribute to the dark current. Thus, the germanium EPI layer may be p-doped and such concentration as to reduce a depletion region width at an interface between the silicon and germanium EPI layers, and thereby suppress thermal generation of electrons across the interface. A third feature is that the germanium EPI layer, on the one side interfaces with the silicon EPI, and on the other, is passivated by a thin silicon EPI layer. In some implementations, however, a thicker silicon EPI may be used. In effect, the germanium EPI layer is a buried layer—in contrast to conventional lateral p-n junction-based detectors, where the junction extends to the surface. A buried layer may have comparatively fewer defects due to the absence of surface states and therefore a lower dark current generation rate.

Operationally, a differential TOF-sensor pixel of imaging sensor array 38 may be more immune to problematic dark currents than in the pixels of an RGB camera, for the following additional reasons. First, the integration times may be one or two orders of magnitude smaller than in a conventional imaging pixel. The dark current generated in this short period also may be correspondingly smaller. Thus, the problems associated with a higher dark current are mitigated by the shorter integration time. Second, the proposed pixel operates in a differential mode—i.e., the meaningful signal is the difference between the signals (charge collected) from the individual polyfingers. Accordingly, the dark current collected by the two gates may cancel in difference. The only surviving component of dark current in imaging sensor array 38, in effect, is the shot noise from the dark current collected by the polyfingers. This also may be reduced by optimizing the doping of the germanium EPI layer. In some examples, therefore, the germanium EPI layer may be p-doped at such concentration as to reduce a minority-carrier electron concentration in the germanium EPI layer to a level at which dark current in the imaging sensor array is minimized.

Dark current generation in germanium may also be reduced by decreasing the amount of germanium used in each pixel, as described hereinafter. To preserve high quantum efficiency, various light shaping structures may be used at the backside of the pixel to cause the incident light to be trapped within the pixel by total internal reflection. As a result, light can traverse the germanium EPI layer multiple times, thereby increasing absorption. Furthermore, microlenses may be used to focus the light to a smaller spot size, thereby reducing the size of the required germanium portion.

As noted above, one method of incorporating the germanium EPI includes depositing a blanket layer of germanium on the backside of a completed CMOS camera wafer that has been thinned to a specific thickness. More generally, however, the imaging sensor array may be arranged on a semiconductor wafer with sensor-addressing circuitry fabricated thereon, and the germanium EPI layer may be spaced apart from the sensor-addressing circuitry. Thus, the detailed implementation of the method of FIG. 2A may include masking to limit growth of germanium to within boundaries of the pixel array or to boundaries within a portion of individual pixels in the imaging sensor array.

Figure 6:
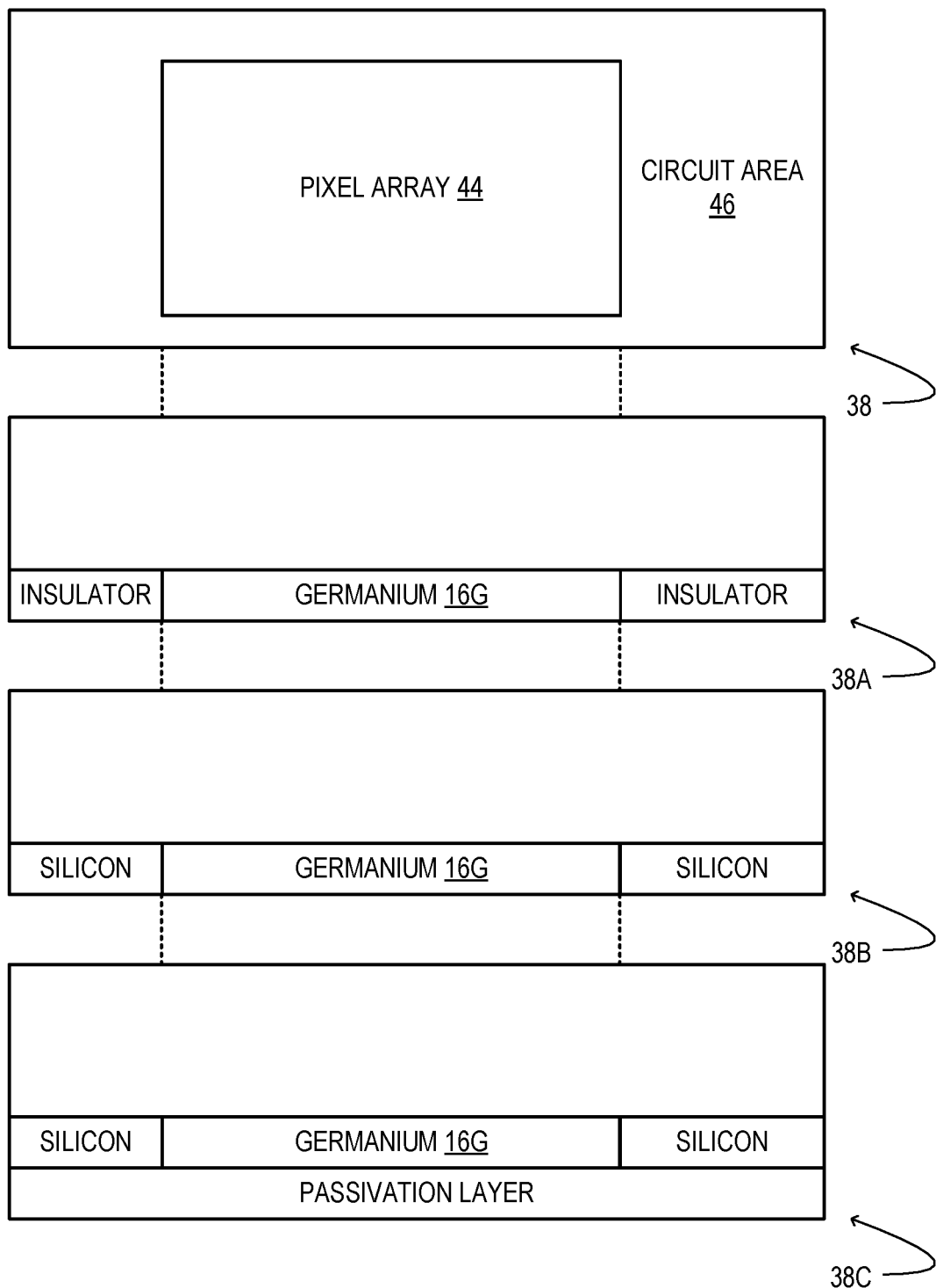
FIG. 6 shows aspects of example germanium-modified, back-side illuminated time-of-flight sensor wafers in which a germanium EPI layer is selectively deposited under the pixel array.

In the example shown in FIG. 6, germanium EPI layer 16G may be selectively deposited under pixel array 44, and not under the analog and digital circuit area 46. This architecture, shown at 38A, may have the added advantage of avoiding the introduction of noise in the circuitry, since light of λ>1000 nm incident directly on or straying into the area does not generate electron-hole pairs capable of being collected by the diffusion regions. It will be noted that it is not only direct illumination that is of concern (which may be avoided by shielding), but also light that is conveyed by total internal reflections from the pixel area to the circuit area. In related example 38B, another material, such as silicon is deposited below circuit area 46. In related example 38C, an additional passivation layer (optionally Si) is applied below the Ge/Si mixed layer.

Figure 7:
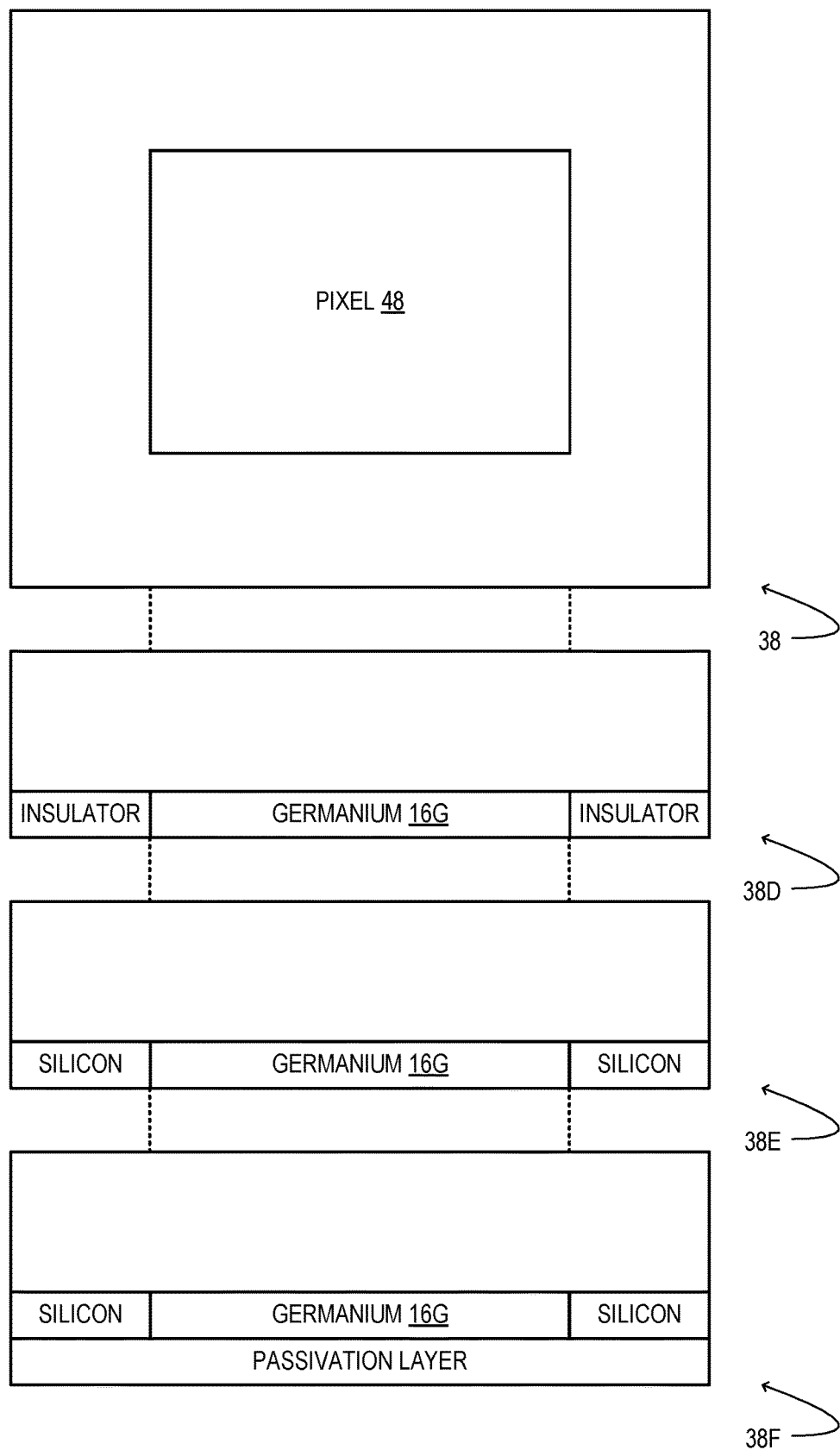
FIG. 7 shows aspects of example germanium-modified, back-side illuminated time-of-flight sensor wafers in which a germanium EPI layer is selectively deposited in an area around the center of each pixel.

In still other examples, as shown in FIG. 7, a germanium EPI layer 16G may be selectively deposited in an area around the center of the pixel 48 and surrounded by oxide, by silicon, or by other materials. Thus, the detailed implementation of the method of FIG. 2A may include masking to limit growth of germanium to within boundaries of the pixel array or to boundaries within a portion of individual pixels in the imaging sensor array and growing a layer of another semiconductor or any other material as a capping layer. In example 38D, the germanium EPI layer is selectively formed at plurality of pixel portions of the imaging sensor array, with an insulator or a semiconductor (e.g., Si, as illustrated in examples 38E and 38F) separating the germanium between the pixel portions. In some examples, the portion of the pixel area covered by the germanium EPI layer may be smaller than the actual pixel area. Since the germanium EPI layer is confined to a small region within the pixel area, it may be free of stresses and defects that could enhance generation-recombination rates.

In some examples, the very low absorbance of silicon to the wavelengths greater than 1000 nm (where germanium is excited) may be used to an advantage. For instance, the optical stack and microlens array 160' applied to the germanium EPI layer may comprise epitaxial silicon, in whole or in part. This additional silicon EPI layer may be patterned and/or etched to any desired profile, including profiles configured to provide optical (i.e., focusing) power. Such profiles, when formed in silicon (with a refractive index n~3.98) may require very little curvature to achieve significant optical power. As a result, an optical stack comprising elemental silicon may be much thinner than a functionally equivalent stack comprising conventional optical materials (e.g., silica glass at n~1.46). In one example, a silicon microlens array applied over the germanium EPI layer may be used to focus light on the individual pixel elements of the array.

In other examples, the silicon wafer itself may be patterned and/or etched to provide a desired optical effect optically downstream of the germanium EPI layer. In particular, light that has already passed through the germanium EPI layer but was not absorbed (due to the thinness of the layer) may be redirected back through the germanium EPI layer and focused on the appropriate Ge-containing pixel area. In some examples, this and other forms of optical structure fabrication may be applied to both the front and back of the sensor array, so that the image light makes multiple passes through the germanium EPI layer until it is eventually absorbed, in a cavity ring-down manner. This strategy may be used to improve quantum efficiency in very thin germanium EPI layers (advantageous for the reasons discussed above).

Figure 8:
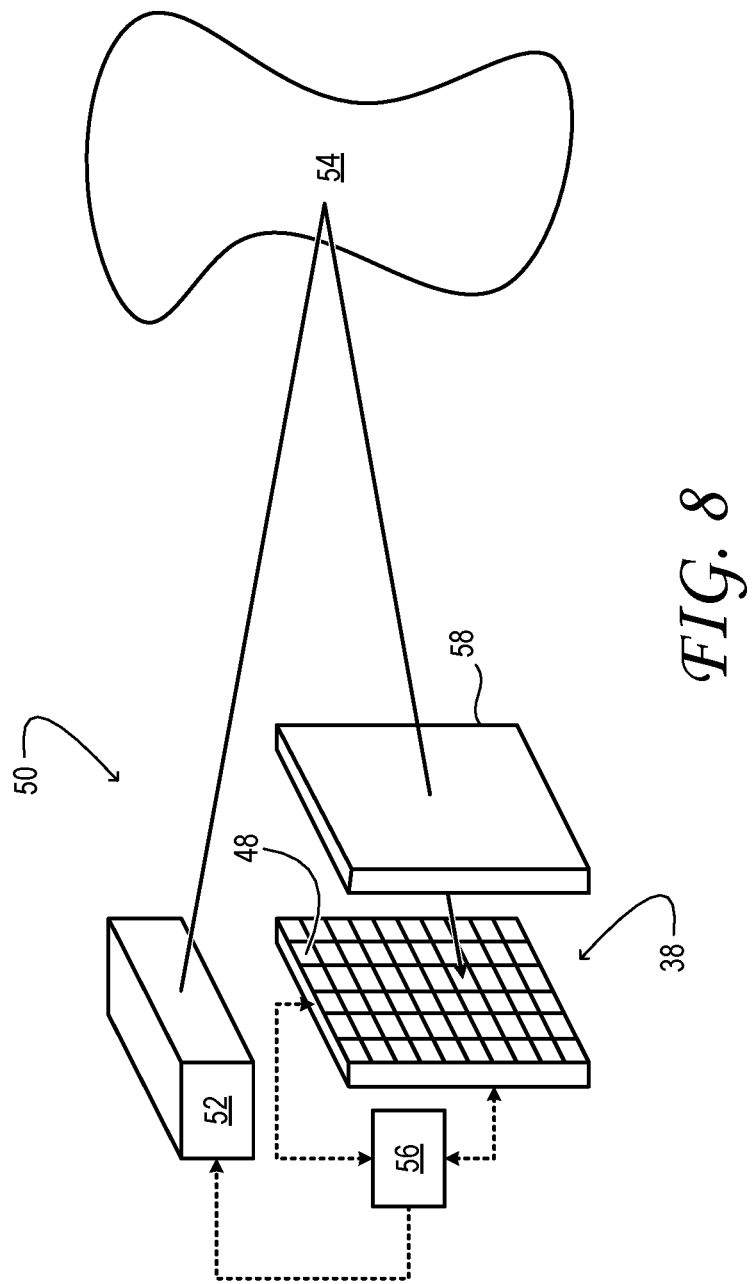
FIG. 8 shows aspects of an example depth imaging camera employing the imaging sensor array of FIG. 4.

FIG. 8 schematically shows aspects of an example time-of-flight depth camera 50 that incorporates imaging sensor array 38. The depth camera includes an emitter 52 configured to irradiate subject 54 with modulated light—inusoidally modulated, pulse modulated, or modulated according to any other periodic waveform. In a more particular embodiment, the emitter may be a programmable near-infrared laser capable of emitting in a continuous-modulation mode or in a repeating-burst mode. Continuing in FIG. 8, some modulated light from the emitter reflects back from the subject to imaging sensor array 38, which includes an array of sensor elements 48. Because the light pulses received at the photodetector array have traveled out to the subject and back, they differ in phase from the pulse train released by the emitter. The phase difference varies (e.g., increases) in proportion to the distance the subject is from the depth camera, but wraps upon reaching a 2 π radian phase shift. By determining the phase shift for each pixel of the array, a depth map of the imaged subject can be computed. Driver 56 provides synchronized drive signals to the emitter and to the array for the purpose of determining the phase shift. In examples in which each sensor element of the imaging sensor array includes a pair of polyfinger electrodes (not shown in FIG. 8), those electrodes may be driven out of phase from each other by 180°. Alternative drive modes are also envisaged.

To provide some measure of ambient-light rejection, imaging sensor array 38 is arranged behind an optical band-pass filter 58. In this arrangement, the pixels of the imaging sensor array are substantially insensitive to light outside the passband of the filter. Preferably, the passband is chosen to match the emission wavelength band of emitter 52. In one embodiment, the emitter may be a narrow-band infrared (IR) emitter such as an IR laser or IR light-emitting diode (LED). Irradiance and photo-detection in the IR provides an additional advantage in that a human subject will not detect the irradiance from the emitter. In some examples, the passband of the filter may be set to greater than 1000 nm for the reasons described hereinabove. Accordingly, the passband filter may be configured to transmit at least some wavelengths longer than one micron and to block wavelengths shorter than one micron. In some examples, the passband filter may include a notch filter. In other examples, the passband filter may include a high-pass filter (as defined in terms of wavelength).

With respect to the pulsed output of emitter 52, this disclosure embraces a broad range of output power and modulation pulse width. In one non-limiting embodiment, the pulse width may be about one half of the reciprocal of the modulation frequency. Along with the output power, the modulation frequency appropriate for a given depth-sensing application depends on the distance between subject 54 and depth camera 50. For distances on the order of three meters, each modulation cycle of the emitter may be 20 nanoseconds (ns); the ON pulse width within that modulation cycle may be about 10 ns, for a 50% duty cycle. It will be noted, however, that other ranges and modulation frequencies are fully consistent with the spirit and scope of this disclosure.

One aspect of this disclosure is directed to an imaging sensor array comprising an epitaxial germanium layer disposed on a silicon layer, and an electrically biased photoelectron collector arranged on the silicon layer, on a side opposite the germanium layer.

In some implementations, the imaging sensor array is arranged on a semiconductor wafer with sensor-addressing circuitry fabricated thereon, and the germanium layer is spaced apart from the sensor-addressing circuitry in a thickness direction. In some implementations, the germanium layer is selectively formed at plurality of pixel portions of the imaging sensor array, and an insulator or semiconductor separates the germanium between the pixel portions. In some implementations, the germanium layer is bonded to the silicon layer via a material gradation. In some implementations, the germanium layer is p-doped at such concentration as to align the conduction bands of silicon and germanium to achieve substantially complete injection of electrons transported from within the germanium layer to an interface between the silicon and germanium layers. In some implementations, the germanium layer is p-doped at such concentration as to reduce a minority-carrier electron concentration in the germanium layer to a level at which dark current in the imaging sensor array is minimized. In some implementations, the germanium layer is p-doped and such concentration as to reduce a depletion region width at an interface between the silicon and germanium layers, and thereby suppress thermal generation of electrons across the interface. In some implementations, the germanium layer is p-doped with a gradient, so as to impart an electric field low enough to avoid trap-assisted tunneling (TAT) while providing driving force to photoelectrons generated within the germanium layer to drift to an interface between the silicon and germanium layers. In some implementations, the imaging sensor array is a time-of-flight sensor array, wherein the photoelectron collector includes first and second electrodes, and wherein electrical bias applied to the first electrode is shifted in phase with respect to electrical bias applied to the second electrode. In some implementations, the first and second electrodes are polyfinger electrodes. In some implementations, the camera further comprises one or both of a microlens array and an anti-reflection layer. In some implementations, the camera further comprises a microlens array based on elemental silicon as a refractive medium. In some implementations, the camera further comprises a structure configured to promote cavity ring-down absorption in the germanium layer via internal reflection of light admitted to the germanium layer.

Another aspect of this disclosure is directed to a camera comprising: an imaging sensor array including an epitaxial germanium layer disposed on a silicon layer, and an electrically biased photoelectron collector arranged on the silicon layer, on a side opposite the germanium layer; and arranged between the imaging sensor array and a photographic subject, a passband filter configured to transmit at least some wavelengths longer than one micron and to block wavelengths shorter than one micron.

In some implementations, the camera further comprises a modulated emitter and a controller configured to address the imaging sensor array in synchronicity with the modulated emitter.

Another aspect of this disclosure is directed to a method of fabricating an imaging sensor array, the method comprising: patterning a silicon wafer, to include forming photoelectron collector on a backside of silicon wafer, the silicon wafer having been flipped after being bonded to handling wafer subsequent to the completion of front-end-of-line (FEOL) and back-end-of-line (BEOL) process steps, wherein the wafer is patterned at an FEOL face and at a BEOL face; thinning the patterned silicon wafer from the FEOL face; and forming an epitaxial germanium layer on the thinned, patterned silicon wafer on the FEOL face.

In some implementations, forming the epitaxial germanium layer includes depositing by chemical vapor deposition. In some implementations, forming the epitaxial germanium layer includes forming the epitaxial germanium layer at 410° C. or lower. In some implementations, forming the epitaxial germanium layer includes applying a seed layer comprising germanium to initiate growth of the germanium layer. In some implementations, said thinning includes thinning to less than six microns, and wherein disposing the epitaxial germanium layer includes growing germanium to a thickness of one-half to one micron.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An imaging sensor array comprising:
   an electrically biased photoelectron collector formed on a silicon transport layer;
   an epitaxial germanium layer grown on the silicon transport layer, on a side opposite the photoelectron collector;
   a silicon passivation layer grown on the epitaxial germanium layer, on a side opposite the silicon transport layer; and
   a light-shaping structure formed on the photoelectron collector, on the side opposite the epitaxial germanium layer, the light-shaping structure being configured to cause light incident on the epitaxial germanium layer to reflect repeatedly through the epitaxial germanium layer, thereby increasing absorption.

2. The imaging sensor array of claim 1 wherein the imaging sensor array is arranged on a semiconductor wafer with sensor-addressing circuitry fabricated thereon, and wherein the epitaxial germanium layer is spaced apart from the sensor-addressing circuitry in a thickness direction, such that the epitaxial germanium layer includes no p-n junction.

3. The imaging sensor array of claim 1 wherein the epitaxial germanium layer is selectively formed at plurality of pixel portions of the imaging sensor array, and wherein an insulator or semiconductor arranged between the pixel positions separates portions of the epitaxial germanium layer.

4. The imaging sensor array of claim 1 wherein the epitaxial germanium layer is bonded to the silicon transport layer via a material gradation.

5. The imaging sensor array of claim 1 wherein the epitaxial germanium layer is p-doped at such concentration as to align the conduction bands of silicon and germanium to achieve substantially complete injection of electrons transported from within the epitaxial germanium layer to an interface between the silicon transport and epitaxial germanium layers.

6. The imaging sensor array of claim 1 wherein the epitaxial germanium layer is p-doped at such concentration as to reduce a minority-carrier electron concentration to suppress dark current.

7. The imaging sensor array of claim 1 wherein the epitaxial germanium layer is p-doped and such concentration as to reduce a depletion region width at an interface between the silicon transport and epitaxial germanium layers, and thereby suppress thermal generation of electrons across the interface.

8. The imaging sensor array of claim 1 wherein the epitaxial germanium layer is p-doped with a gradient, so as to impart an electric field low enough to avoid trap-assisted tunneling (TAT) while providing driving force to photoelectrons generated within the epitaxial germanium layer to drift to an interface between the silicon transport and epitaxial germanium layers.

9. The imaging sensor array of claim 1 wherein the imaging sensor array is a time-of-flight sensor array, wherein the photoelectron collector includes first and second electrodes, and wherein electrical bias applied to the first electrode is shifted in phase with respect to electrical bias applied to the second electrode.

10. The imaging sensor array of claim 9 wherein the first and second electrodes are polyfinger electrodes.

11. The imaging sensor array of claim 1, further comprising one or both of a microlens array and an anti-reflection layer.

12. The imaging sensor array of claim 1, further comprising a microlens array based on elemental silicon as a refractive medium.

13. The imaging sensor array of claim 1 further comprising a structure configured to promote cavity ring-down absorption in the epitaxial germanium layer via internal reflection of light admitted to the epitaxial germanium layer.

14. A camera comprising:
an imaging sensor array including an electrically biased photoelectron collector formed on a silicon transport layer 3 microns or less in thickness, and an epitaxial germanium layer 1 micron or less in thickness grown on the silicon transport layer, on a side opposite the photoelectron collector; and
arranged between the imaging sensor array and a photographic subject, a passband filter configured to transmit at least some wavelengths longer than one micron and to block wavelengths shorter than one micron.

15. The camera of claim 14 further comprising a modulated emitter and a controller configured to address the imaging sensor array in synchronicity with the modulated emitter.

16. An imaging sensor array comprising:
an electrically biased photoelectron collector formed on a silicon transport layer;
an epitaxial germanium layer grown on the silicon transport layer, on a side opposite the photoelectron collector;
a light-shaping structure formed on the photoelectron collector, on a side opposite the epitaxial germanium layer, the light-shaping structure being configured to cause light incident on the epitaxial germanium layer to reflect repeatedly through the epitaxial germanium layer, thereby increasing absorption; and
a silicon passivation layer grown on the epitaxial germanium layer, on a side opposite the silicon transport layer, wherein the silicon transport layer is 3 microns or less in thickness.

17. The imaging sensor array of claim 1 wherein the silicon transport layer is 3 microns or less in thickness, and wherein the epitaxial germanium layer is 1 micron or less in thickness.

* * * * *